(12) United States Patent
Chen et al.

(10) Patent No.: US 7,864,562 B2
(45) Date of Patent: Jan. 4, 2011

(54) INTEGRATED CIRCUIT MEMORY ACCESS MECHANISMS

(75) Inventors: Gregory Kengho Chen, Ann Arbor, MI (US); Dennis Michael Sylvester, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 120 days.

(21) Appl. No.: 12/379,820

(22) Filed: Mar. 2, 2009

(65) Prior Publication Data

US 2010/0220542 A1  Sep. 2, 2010

(51) Int. Cl.
*G11C 11/40* (2006.01)
(52) U.S. Cl. .................... 365/154; 365/190
(58) Field of Classification Search .............. 365/156
See application file for complete search history.

(56) References Cited

U.S. PATENT DOCUMENTS

| | | | | |
|---|---|---|---|---|
| 5,424,995 A * | 6/1995 | Miyazaki et al. | ....... | 365/230.05 |
| 5,774,393 A * | 6/1998 | Kuriyama | ............ | 365/156 |
| 5,808,933 A * | 9/1998 | Ross et al. | ............ | 365/156 |
| 6,804,143 B1 * | 10/2004 | Hobson | ............ | 365/154 |
| 7,362,606 B2 * | 4/2008 | Chuang et al. | ............ | 365/154 |

OTHER PUBLICATIONS

Kawasumi et al., "A Single-Power-Supply 0.7V 1 GHz 45nm SRAM with an Asymmetrical Unit-β-ratio Memory Cell", ISSCC 2008, Session 21, SRAM, 21-4 (3 pages), Feb. 2008.
Azizi et al., "Low-Leakage Asymmetric-Cell SRAM", *IEEE Transactions on Vlsi Systems*, vol. 11, No. 4, Aug. 2003, pp. 701-715.
Chang et al., "An 8T-SRAM for Variability Tolerance and Low-Voltage Operation in High-Performance Caches", *IEEE Journal of Solid-State Circuits*, vol. 43, No. 4, Apr. 2008, pp. 956-963.

* cited by examiner

*Primary Examiner*—Tan T. Nguyen
(74) *Attorney, Agent, or Firm*—Nixon & Vanderhye P.C.

(57) ABSTRACT

A memory cell 36 within an integrated circuit memory is provided with an access controller 32 coupled to a first pass gate 38 and a second pass gate 40. During a write access to the memory cell 38 both the first pass gate 38 and the second pass gate 40 are opened. During a read access, the first pass gate 38 is opened and the second pass gate 40 is closed. This asymmetry in the read and write operations permits an asymmetry in the gates forming the memory cell 36 thereby permitting changes to increase both read robustness and write robustness. The asymmetry in the design parameters of different gates can take the form of varying the gate length, the gate width and the threshold voltage so as to vary the conductance of different gates to suit their individual role within the memory cell 36 which is operating in the asymmetric manner provided by the separate word line signals driving read operations and write operations.

17 Claims, 4 Drawing Sheets

Read Robustness

Write Robustness

INTEGRATED CIRCUIT MEMORY ACCESS MECHANISMS

BACKGROUND OF THE INVENTION

1. Field of the Invention

This invention relates to the field of integrated circuit memories. More particularly, this invention relates to access mechanisms used for reading and writing data values within integrated circuit memories.

2. Description of the Prior Art

It is desirable within the field of integrated circuit memories that the storage density should be high thereby enabling large quantities of data to be stored. Furthermore, it is desirable that the power consumption of the integrated circuit memories should be low and their cost should be low. In order to help meet these requirements there has been a steady trend to the use of smaller device geometries. These smaller devices, such as devices based upon 45 nm manufacturing techniques, enable higher density memories to be achieved with lower power consumption. However, a problem with the use of smaller devices is that they are more susceptible to manufacturing variation whereby imperfect manufacture causes a device to differ from its original design characteristics. As an example, a transistor within the memory may be stronger or weaker than intended due to variation in its size, threshold voltage or some other parameter. This variation may result in the device failing to operate as intended and causing a failure within the integrated circuit memory. This reduces the manufacturing yield which may be achieved and makes the integrated circuit memories more expensive.

Examples of failures which can arise within integrate circuit memories include failures in write and/or read operations to individual data retention circuits (memory cells). A lack of robustness in write and read operations is becoming a significant problem in the production of high density, low power and low cost integrated circuit memories.

FIGS. 1 to 3 of the accompanying drawings illustrate three known memory cell designs seeking to improve robustness of operation. FIG. 1 shows a memory cell formed of a data retention circuit 2 in the form of a pair of cross-coupled inverters. The first inverter is formed of the transistor stack extending from $V_{dd}$ to ground and comprising transistors 4, 6. The second inverter is formed of transistors 8, 10. Pass gates 12, 14 switched by a word line signal WL selectively couple the data values stored within the data retention circuit 2 on to bit lines 16, 18. The portion of the memory cell so far described corresponds to a standard six transistor (6T) memory cell. This 6T memory cell uses a small number of gates and may be readily and effectively manufactured and validated.

However, a problem with the 6T memory cell at small device geometries is that variation in the characteristics of the individual devices (transistors/gates) can result in incorrect read operation and/or incorrect write operation. As an example, a read upset may occur when seeking to read a bit value stored within the data retention circuit 2 if, as the pass gates 12, 14 are opened using the word line signal WL, the feedback within the data retention circuit 2 is insufficient to prevent an in-rush of charge from the precharged bit lines 16, 18 overwhelming the data retention circuit 2 and causing a change in the bit value stored therein. Subsequently the incorrect value would be read from the data retention circuit 2.

In order to address this problem the memory cell of FIG. 1 provides a separate read path formed of transistors 20 and 22 which selectively couple the data value held within the data retention circuit 2 to a separate bit line 24 which serves as a read bit line. Separating of the read mechanism in this way enables less conductive ("weaker") transistors to be used as transistors 20 and 24 thereby limiting the potential in-rush of charge when a read operation is performed. This arrangement allows the bit lines 16, 18 coupled to the pass gates 12, 14 to be used only for write operations to the data retention circuit 2. Thus, the less conductive transistors 20 and 22 on the read path will not unduly impact the ability to write to the data retention circuit 2 from the bit lines which involves forcing a change of state of the data retention circuit 2. Forcing such a change of state of the data retention circuit 2 would be difficult if the pass gates 12, 14 were made insufficiently conductive, thereby impacting the write robustness. It will thus be seen that there is a dichotomy between the requirements of the read operation and the requirements of the write operation in order to achieve robust operation.

While the memory cell of FIG. 1 is able to improve the overall robustness of operation by providing a separate read and write mechanism, it suffers from the significant advantage that the number of transistors within the memory cell has increased from six to eight compared with a standard 6T memory cell. This reduces the memory cell density which can be achieved as well as increasing the power consumption and cost of the integrated circuit memory.

FIGS. 2 and 3 of the accompanying drawings also illustrate known memory cell designs in which the read mechanism has been separated from the write mechanism. These further known memory cell designs also both suffer from the disadvantage of requiring a higher number of dates per sell and the same disadvantages as discussed above in relation to FIG. 1.

It is desirable to be able to provide an integrated circuit memory with increased robustness of operation and which does not disadvantageously increase the number of devices required for each memory cell.

SUMMARY OF THE INVENTION

Viewed from one aspect the present invention provides an integrated circuit memory comprising:

a memory cell having:
 (i) a bit value retention circuit;
 (ii) a first gate circuit selectively coupling said bit value retention circuit to a first node; and
 (iii) a second gate circuit selectively coupling said bit value retention circuit to a second node; and an access controller coupled to said first gate circuit and to said second gate circuit, said access controller being configured such that:

during a write access to said bit value retention circuit, said access controller controls said first gate circuit and said second gate circuit to both open; and during a read access to said bit value retention circuit, said access controller controls said first gate circuit to open and said second gate circuit to close.

The present technique recognises that the first gate circuit and the second gate circuit which selectively couple the bit value retention circuit to respective nodes (such as bit lines) need not be controlled symmetrically such that during a write access both the first gate circuit and the second gate circuit may be opened whereas during a read access the first gate circuit may be opened and the second gate circuit may be closed. This asymmetric control of the first gate circuit and the second gate circuit permits a variety of design variations to be applied within the memory cell increasing its robustness of operation and yet not requiring a higher number of transistors.

The asymmetric control of the first gate circuit and the second gate circuit may be conveniently achieved by the use of a first word line coupled to the first gate circuit and a second word line, separate from the first word line, coupled to the second gate circuit. These separate word lines can then be used to simultaneously open both the first gate circuit and the second gate circuit or to selectively open only the first gate circuit while the second gate circuit remains closed.

The first gate circuit and the second gate circuit may comprise a first pass gate and a second pass gate with the first pass gate and the second pass gate having respective design parameters giving the first pass gate a lower conductance than the second pass gate. Giving the first pass gate a lower conductance and the second pass gate (i.e. making the first pass gate "weak") has the result that the portions of the bit value retention circuit coupled to the first pass gate are less likely to be overwhelmed by an in-rush of charge when a read operation is performed resulting in a reduced likelihood of read upsets and more robust operation.

It will be appreciated that the design parameters which may be varied in order that the first pass gate should have a lower conductance than the second pass gate can take a number of different forms used separately or in combination, such as variations in gate width, gate length and threshold voltages as well as other properties. These design parameters and others may be used in varying the conductance of other gates within the memory cell as described further below.

The bit value retention circuit conveniently takes the form of a first inverter and a second inverter with an output of the first inverter being coupled to an input of the second inverter and via the first pass gate to the first node and an output of the second inverter being coupled to an input of the first inverter and via a second pass gate to the second node. In this way, the bit value retention circuit may take the form of cross-coupled inverters.

In the context of such a bit value retention circuit, the first inverter may comprise a first transistor stack having a first pull-up gate coupled to a first supply rail and a first pull-down gate coupled to a second supply rail and the second inverter may comprises a second transistor stack having a second pull-up gate coupled to the first supply rail and a second pull-down gate coupled to the second supply rail.

It will be appreciated that the nodes via which data access is made to the data retention circuit may be precharged so as to be discharged during a read or precharged so as to be charged during a read. When the nodes are to be selectively discharged via the second supply rail during a read operation, the first pull-down gate and the second pull-down gate can be formed to have respective design parameters giving the first pull-down gate a higher conductance than the second pull-down gate. Making the first pull-down gate "stronger" in this way increases the read robustness by reducing the likelihood that an in-rush of charge from the first node will overwhelm the first pull-down gate and result in a change in the bit value stored by the data retention circuit (a read upset).

In embodiments in which during a read access the first node is selectively charged via the first supply rail, the first pull-up gate and the second pull-up gate can be formed to have respective design parameters giving the first pull-up gate a higher conductance than the second pull-up gate. Forming a "strong" first pull-up gate in this way similarly increases read robustness by resisting the likelihood of an out-rush of charge from the data retention circuit to the first node overwhelming the first pull-up gate and changing the data value stored.

In the context of a memory cell in which the first pass gate has been formed so as to be weaker than the second pass gate (e.g. to improve read robustness), during a write access that forces a change in signal level of the output of the first inverter away from a signal level of the first supply rail, the first pull-up gate will act to oppose this change. Given that the first pass gate is weak, the likelihood of the first pull-up gate being too strong to permit a write (and thereby causing a write error) can be reduced by forming the memory circuit such that the first pull-up gate and the second pull-up gate have respective design parameters giving the first pull-up gate a lower conductance than the second pull-up gate. Forming the first pull-up gate with a lower conductance (i.e. "weak") has the result that the weak first pass gate is still able to force a change of state necessary for a write operation.

In alternative embodiments it may be that during a write access that forces a change in signal level of the output of the first inverter away from the signal level of the second supply rail, the first pull-down gate will act to oppose this change. In this context the first pull-down gate and the second pull-down gate can be formed to have respective design parameters giving the first pull-down gate a lower conductance than the second pull-down gate. Thus, forming a "weak" first pull-down gate in this way reduces the likelihood that the "weak" first-pass gate will be unable to force a write.

It will be appreciated that the present techniques requiring asymmetric control of the first gate circuit and the second gate circuit with respect to read and write operations impose an additional control signal routing requirement. However, within the context of standard cell memories there is sufficient space to accommodate the first word line and the second word line both passing across the standard cell without difficulty as such routing space is not a problematic design constraint within such memory cells.

Viewed from another aspect the present invention provides an integrated circuit memory comprising:
  memory cell means having:
    (i) bit value retention means for retaining a bit value;
    (ii) first gate means for selectively coupling said bit value retention means to a first node means; and
    (iii) second gate means for selectively coupling said bit value retention means to a second node means; and
  access control means for controlling said first gate means and said second gate means such that:
    during a write access to said bit value retention means said first gate means and said second gate means are both open; and
    during a read access to said bit value retention means said first gate circuit is open and said second gate means is closed.

Viewed from a further aspect the present invention provides a method of controlling an integrated circuit memory having:
  a memory cell having:
    (i) a bit value retention circuit;
    (ii) a first gate circuit selectively coupling said bit value retention circuit to a first node; and
    (iii) a second gate circuit selectively coupling said bit value retention circuit to a second node,
  said method comprising the steps of:
    during a write access to said bit value retention circuit, controlling said first gate circuit and said second gate circuit to both open; and
    during a read access to said bit value retention circuit, controlling said first gate circuit to open and said second gate circuit to close.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
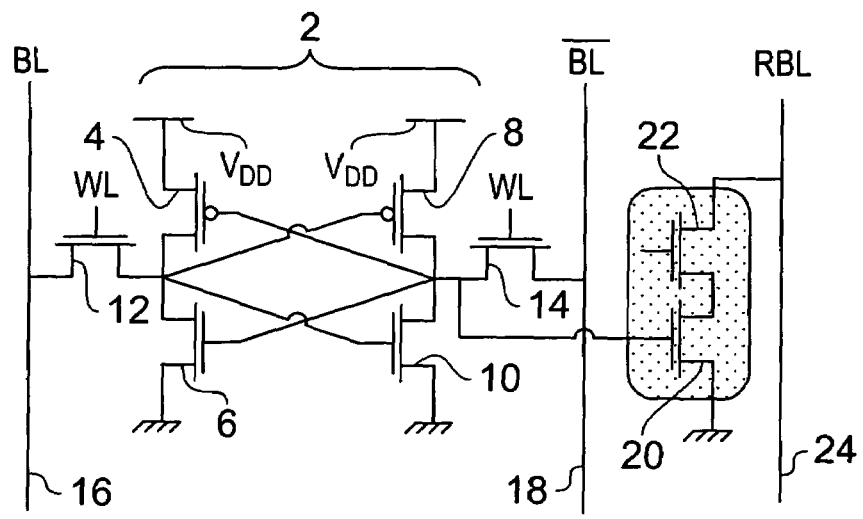
FIGS. 1 to 3 schematically illustrate known memory cell designs having a separate read path.
Figure 2:
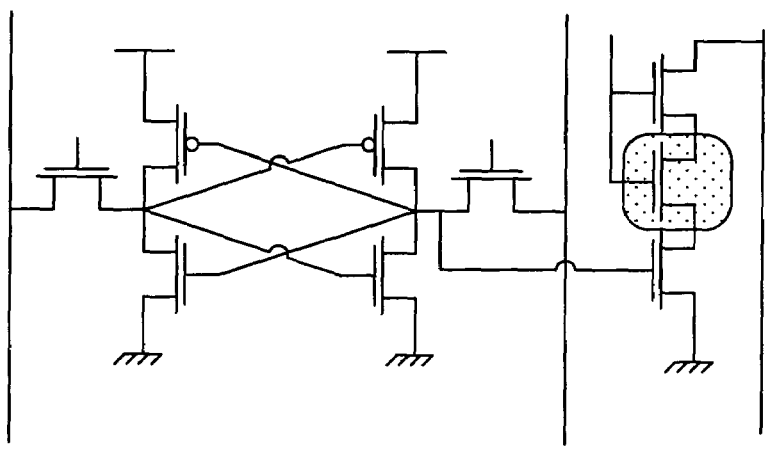
Figure 3:
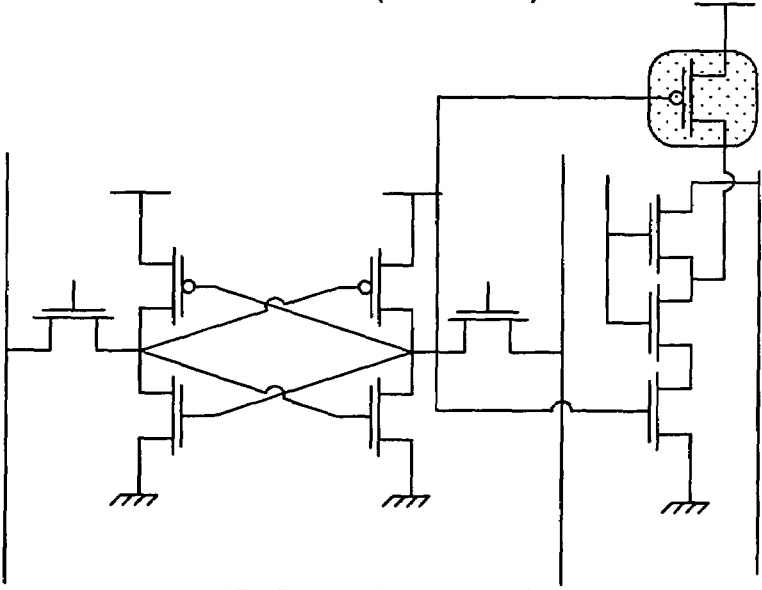
Figure 4:
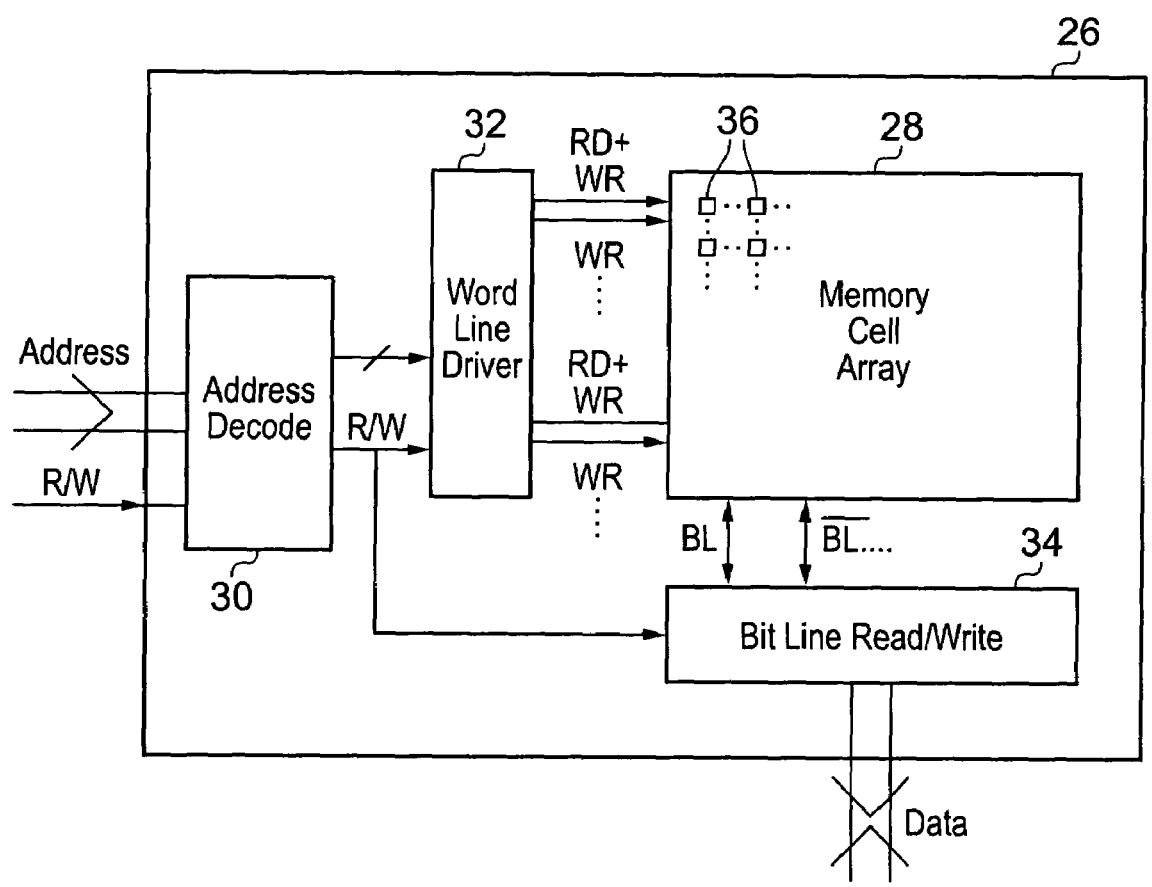
FIG. 4 schematically illustrates an integrated circuit memory in which separate word line signals are provided for the first pass gate and the second pass gate within a memory cell.

FIG. 4 shows an integrated circuit memory 26 including a memory cell array 28, an address decoder 30, a word line driver 32 and a bit line read/write circuit 34. It will be appreciated that the integrated circuit memory 26 will typically include many other circuit elements, but these have been omitted from FIG. 4 for the sake of clarity. It will also be appreciated that the integrated circuit memory 26 may be formed as a discrete package on its own or as part of an integrated circuit which contains other circuit elements, such as a processor core, cache memory, DSP circuit etc (as typically used in system-on-chip integrated circuits).

In operation the integrated circuit memory 26 receives an address to be accessed and a signal indicating whether a read operation or a write operation is to be performed. The address decoder 30 responds to this received address to pass appropriate control signals to the word line driver 32 (which may be considered to be an access controller either on its own or in combination with the address decoder 30) so that the word line driver 32 generates either signals driving only the first word lines (RD+WR) to perform a read or both word lines (RD+WR and WR) to perform a write operation. These word line signals are passed via respective word line conductors (e.g. metal layer lines) to a row of memory cells 36 within the memory cell array 28 and control the respective first pass gate and second pass gates to couple the data retention circuits within the memory cells 36 to the bit lines. The bit line read/write circuit 34 then either senses the voltages on the bit lines during a read operation or forces signal values onto those bit lines during a write operation.

As will be seen in FIG. 4, the word line driver 32 receives a signal from the address decoder 30 indicating whether or not a read operation or a write operation is being performed. In this way, the word line driver 32 is able to identify both which row of memory cells 36 is to be accessed and whether that access is to be a read operation or a write operation. In the case of a read operation, the word line signals generated by the word-line driver 32 will only open the first pass gate of each memory cell within the row whereas during a write operation the word line signals generated will open both the first pass gate and the second pass gate of each memory cell 36 within the row. The word line signals are thus split for the first pass gate and the second pass gate permitting asymmetric control with respect to read operations and write operations.

Figure 5:
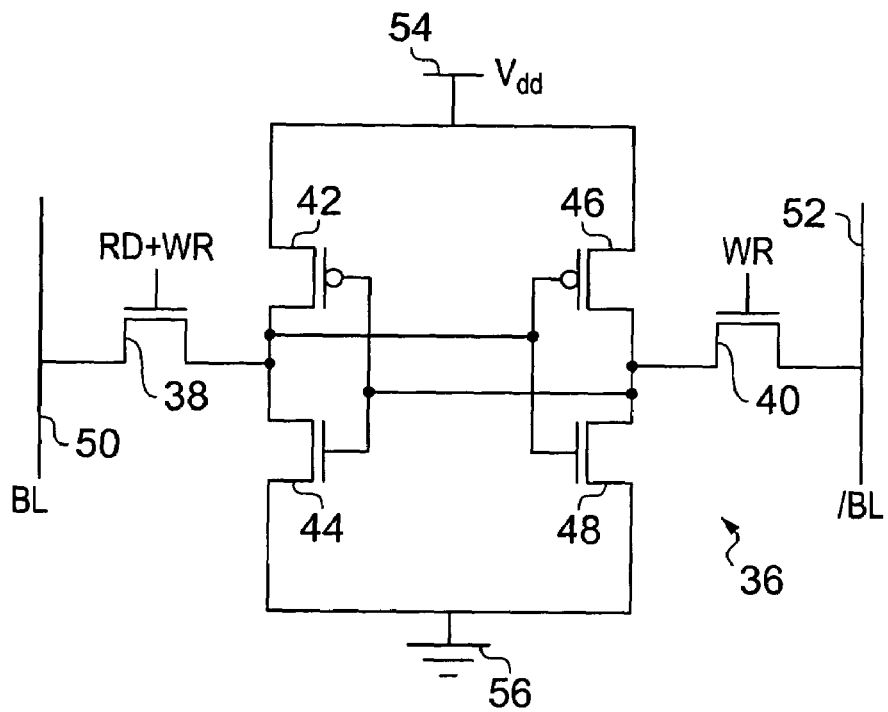
FIG. 5 schematically illustrates a six transistor memory cell in accordance with one example of the present techniques.

FIG. 5 schematically illustrates a memory cell 36 that may be used in accordance with the present techniques. This memory cell comprises six gates being a first pass gate 38, a second pass gate 40, a first pull-up gate 42, a first pull-down gate 44, a second pull-up gate 46 and a second pull-down gate 48. The first pass gate 38 serves to selectively couple the data retention circuit (formed of the gates 42, 44, 46, 48) to a first node comprising a first bit line 50. The second pass gate 40 serves to selectively couple the data retention circuit (formed of the gates 42, 44, 46 and 48) to a second node comprising a second bit line 52.

The first pull-up gate 42 and the first pull-down gate 44 together form a first transistor stack extending between a first supply rail 54 and a second supply rail 56. The first pull-up gate 42 and the first pull-down gate 44 form an inverter with their output coupled to the first pass gate 38. In a similar way, the second pull-up gate 46 and the second pull-down gate 48 form a second transistor stack extending between the first supply rail 54 and the second supply rail 56 and forming a second inverter. The output of this second inverter is coupled via the second pass gate 40 to the second node.

The first pass gate 38 is selectively opened and closed under control of a first word line signal RD+WR supplied on a first word line. The second pass gate 40 is selectively opened and controlled by a second word line signal WR supplied on a separate second word line. The independent control of the first pass gate 38 and the second pass gate 40 enables both to be opened during a write operation whereas during a read operation only the first pass gate 38 will be opened while the second pass gate 40 remains closed.

Figure 6:
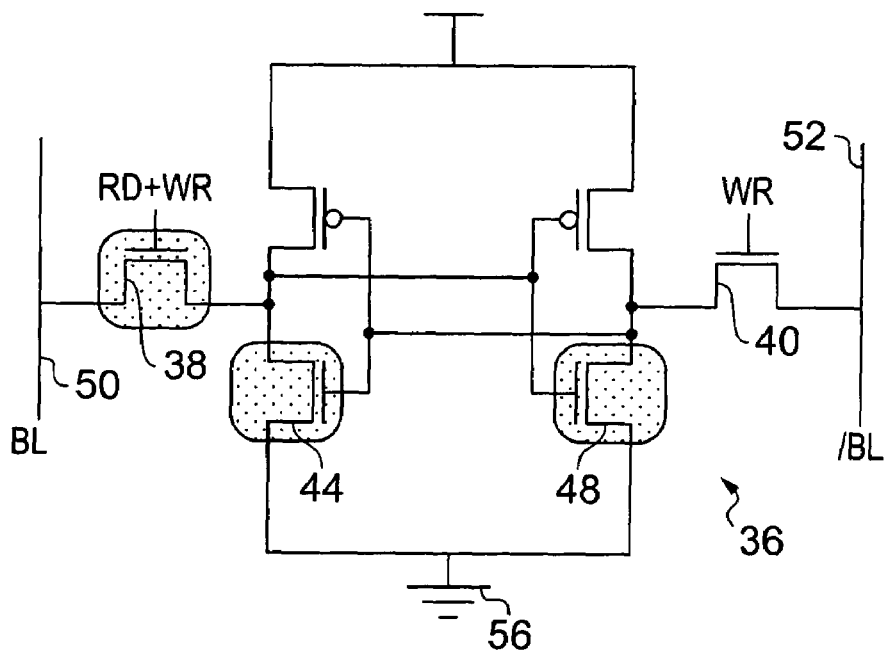
FIG. 6 schematically illustrates the changes in design parameters associated with different gates within the memory cell that may be made to improve read robustness.

FIG. 6 illustrates how the characteristics of the first pass gate 38, the first pull-down gate 44 and the second pull-down gate 48 may be changed relative to a conventional 6T memory cell in order to improve the read robustness and other characteristics of the memory cell 36. It will be understood that a conventional 6T memory cell is symmetrical and it would be normal for the design parameters of the first pass gate 38 and the second pass gate 40 to be the same. In a similar way, the design parameters of the first pull-up gate 42 and the second pull-up gate 46 would be the same and the design parameters of the first pull-down gate 44 and the second pull-down gate 48 would be the same. However, the asymmetric read and write operations provided by the separate word lines of the present technique permit asymmetric device characteristics to be provided within the memory cell 36 to improve read robustness and write robustness and other design parameters. In particular, in order to improve read robustness, the first pass gate 38 may be made "weak" relative to the second pass gate 40. In this context "weak" corresponds to having a lower conductance. This lower conductance reduces the likelihood of an excessive in-rush or out-rush of charge during a read operation to the first node 50 that could cause a read upset. It will be appreciated that due to manufacturing variation the exact conductance of individual gates within the integrated circuit memory will vary from one instance of a memory cell to the next instance of a memory cell. Such variations are encompassed within the present technique and the changes in the design parameters proposed by the present technique are intended to be such that the statistical variations in the exact conductance of individual gates will not frustrate the overall intent of the present technique, such as providing a lower conductance first pass gate 38 to reduce the likelihood of read upsets.

The lower conductance of the first pass gate 38 can be achieved in a variety of different ways. These include altering the physical size, such as the gate length or gate width, as well as parameters such as the threshold voltage, which may be changed by changing the doping characteristics. The conductance may be altered in other ways as will be familiar to those in this technical field. Similar techniques for altering the conductance of other gates within the memory cell 36 as described below may be employed in these other contexts as well as in the context of the first pass gate 38.

In order to further enhance the read robustness, the first pull-down gate 44 can be made to have a higher conductance than the second pull-down gate 48. This will further reduce the likelihood of an in-rush or an out-rush of charge from or to the first node 50 resulting in a read upset when the first pass gate is opened during a read operation.

As well as raising the conductance of the first pull-down gate 44 above the norm as discussed above, it is also possible to reduce the conductance of the second pull-down gate 48 below the norm to provide weaker feedback within the data retention circuit 42, 44, 46, 48 as this is compensated for by the stronger pull-down gate 44 and can save area due to the use of a physically smaller second pull-down gate 48.

It will be appreciated that during the read operation of the memory cell 36 of FIG. 6 the word line driver 32 (access controller) serves to generate word line signals which open the first pass gate 38 while the second pass gate 40 remains closed. Thus, the design parameter changes to increase read robustness are able to exploit this asymmetry of access since design changes need only be made to one side of the memory cell 36. This has the result that design parameter changes which might increase read robustness but be detrimental to write robustness can be at least partially compensated for by other changes elsewhere within the memory cell 36 as will be described in relation to FIG. 7.

Figure 7:
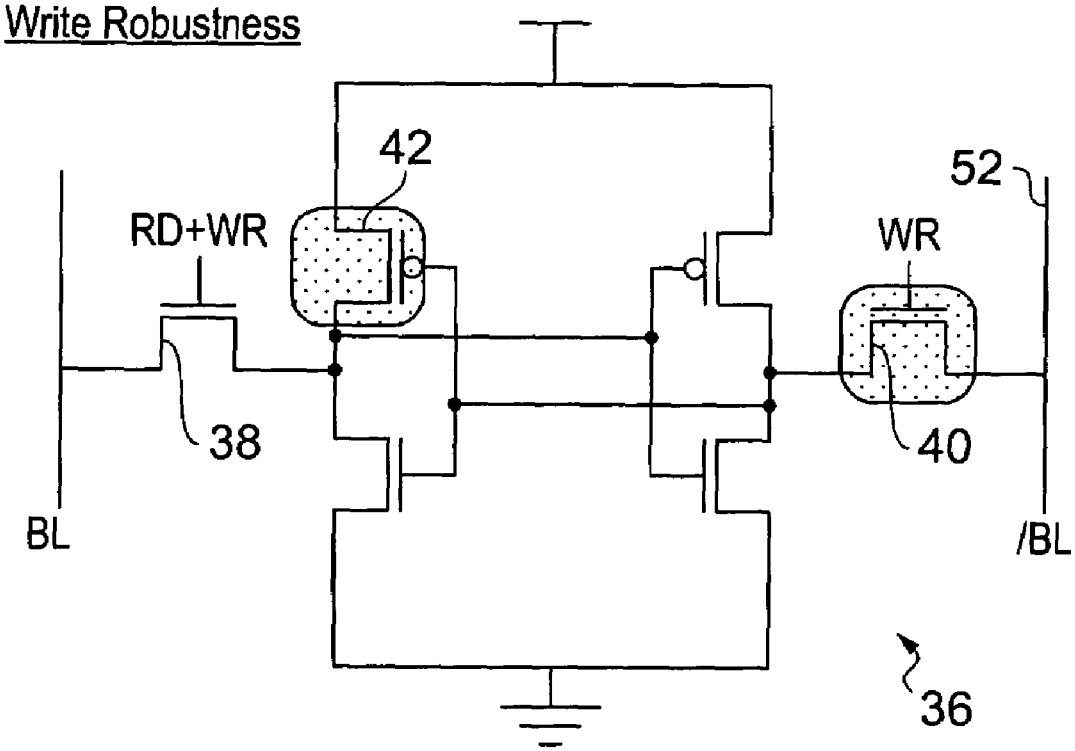
FIG. 7 schematically illustrates the changes in design parameters associated with different gates within the memory cell that may be made to improve write robustness.

FIG. 7 illustrates the memory cell 36 and changes in the design parameters of the second pass gate 40 and the first pull-up gate 42 which may be made to improve write robustness. In particular, the second pass gate 40 is made to have a higher conductance (made "strong") relative to the first pass gate 38. This high conductance of the second pass gate 40 increases the ability of a signal value on the second node 52 being passed through to the data retention circuit 42, 44, 46, 48 and forcing any necessary bit-state flip to occur. In order to further improve the write robustness the first pull-up gate 42 may be made relatively "weak" (by suitable design parameters) such that the action of the first pull-up gate 42 in resisting any change of bit-state due to a write operation can be reduced thereby improving write robustness. The changes discussed above which vary design parameters to make "weak" devices also have the consequence of facilitating those devices being made smaller which is advantageous in saving area particularly as other devices have been made "strong" such as by increasing area (size).

It will be appreciated that the embodiments of FIGS. 6 and 7 and the modifications to the design parameters of the different gates described relate to a memory cell 36 which is operated with a first node 50 and a second node 52 which are precharged high during read operations. It is also possible to produce memory cells 36 in which the first node 50 and the second node 52 are provided by bitlines which are discharged in advance of a read operation. One of the first node 50 and second node 52 then has its potential raised to represent a bit value being read. In these alternative embodiments, it will be appreciated by those familiar with this technical field that the modifications discussed above in relation to the pull-down gates 44, 48 will instead be made to the pull-up gates 42, 46 in order to enhance read robustness and write robustness in this class of memory cells. In a similar way, the modifications made to the pull-up gates 42, 46 will instead be made to the pull-down gates 44, 48. The change in whether the first node 50 and the second node 52 are placed into a high state or a low state prior to a read is reflected by a reversal in the modifications made to the pull-up gates relative to the pull-down gates, i.e. the modifications are flipped. Thus, in this alternative class of memory cell 36 the first pull-up gate 42 would be made strong and the second pull-up gate 46 would be made weak as part of the measures to increase read robustness. Similarly the first pull-down gate 44 would be made "strong" as part of the measures to increase write robustness.

Figure 8:
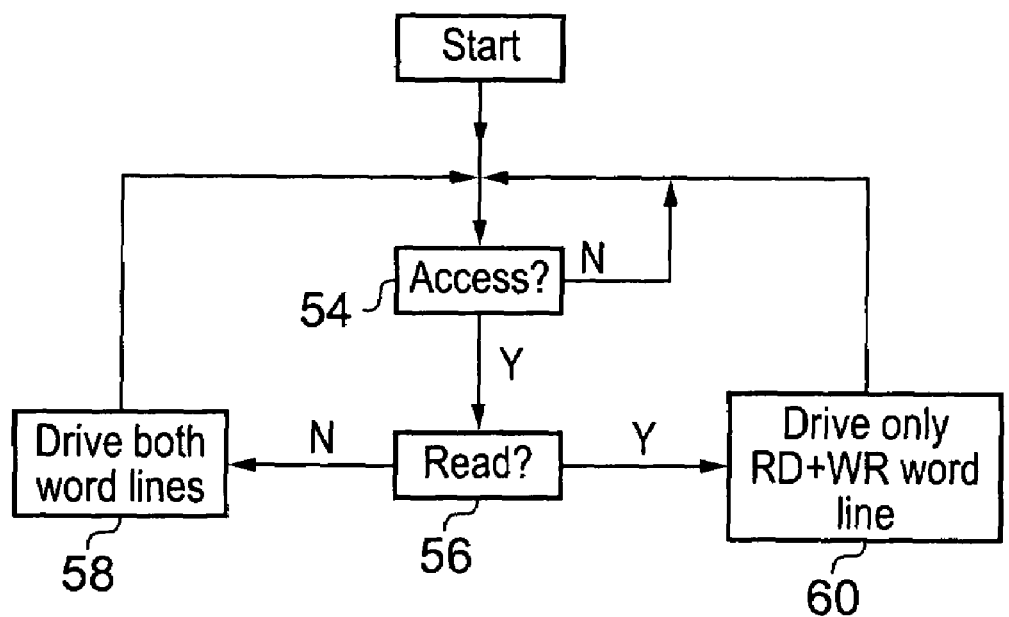
FIG. 8 is a flow diagram schematically illustrating access operations using a separate word lines.

FIG. 8 is a flow diagram schematically illustrating the action of the word line driver 32 in asymmetrically driving the word line signals RD+WR and WR in response to read and write operations. At step 54 processing waits until an access is made. Step 56 then determines whether this is a read access. If the access is not a read access, then it is a write access and processing proceeds to step 58 where both the first word line and the second word line are driven. The first word line and second word line are formed as metal layers routed across the standard cell forming the memory cell 36. These word lines are indicated at the points at which they pass between the word line driver 32 and the memory cell array 28 in FIG. 4. It will be appreciated that these word lines extend further across the row of memory cells 36 within the array.

If the determination at step 56 is that the access is a read access, then processing proceeds to step 60 where only the first word line coupled to the first pass gate 38 is driven. After the access operation is performed processing returns to step 54.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit memory comprising:
   a memory cell having:
      (i) a bit value retention circuit;
      (ii) a first gate circuit selectively coupling said bit value retention circuit to a first node; and
      (iii) a second gate circuit selectively coupling said bit value retention circuit to a second node; and
   an access controller coupled to said first gate circuit and to said second gate circuit, said access controller being configured such that:
   during a write access to said bit value retention circuit, said access controller controls said first gate circuit and said second gate circuit to both open; and
   during a read access to said bit value retention circuit, said access controller controls said first gate circuit to open and said second gate circuit to close.

2. An integrated circuit memory as claimed in claim 1, comprising a first word line coupling said access controller to said first gate circuit and a second word line, separate from said first word line, coupling said access controller to said second gate circuit.

3. An integrated circuit memory as claimed in claim 2, wherein said memory cell is formed as a standard cell within an array of standard cells with said first word line and said second word line both passing across said standard cell.

4. An integrated circuit memory as claimed in claim 1, wherein said first gate circuit comprises a first pass gate and said second gate circuit comprises a second pass gate, said first pass gate and said second pass gate having respective design parameters giving said first pass gate a lower conductance than said second pass gate.

5. An integrated circuit memory as claimed in claim 4, wherein said design parameters include at least one of gate width, gate length and threshold voltage.

6. An integrated circuit memory as claimed in claim 1, wherein said bit value retention circuit comprises a first inverter and a second inverter, an output of said first inverter being coupled to an input of said second inverter and via said first pass gate circuit to said first node and an output of said second inverter being coupled to an input of said first inverter and via said second pass gate circuit to said second node.

7. An integrated circuit memory as claimed in claim 6, wherein said first inverter comprises a first transistor stack having a first pull-up gate coupled to a first supply rail and a first pull-down gate coupled to a second supply rail and said second inverter comprises a second transistor stack having a second pull-up gate coupled to said first supply rail and a second pull-down gate coupled to said second supply rail.

8. An integrated circuit memory as claimed in claim 7, wherein during a read access said first node is selectively discharged via said second supply rail and said first pull-down gate and said second pull-down gate have respective design parameters giving said first pull-down gate a higher conductance than said second pull-down gate.

9. An integrated circuit memory as claimed in claim 8, wherein said design parameters include at least one of gate width, gate length and threshold voltage.

10. An integrated circuit memory as claimed in claim 7, wherein during a read access said first node is selectively charged via said first supply rail and said first pull-up gate and said second pull-up gate have respective design parameters giving said first pull-up gate a higher conductance than said second pull-up gate.

11. An integrated circuit memory as claimed in claim 10, wherein said design parameters include at least one of gate width, gate length and threshold voltage.

12. An integrated circuit memory as claimed in claim 7, wherein
    said first gate circuit comprises a first pass gate and said second gate circuit comprises a second pass gate, said first pass gate and said second pass gate having respective design parameters giving said first pass gate a lower conductance than said second pass gate;
    during a write access that forces a change in a signal level of said output of said first inverter away from a signal level of said first supply rail, said first pull-up gate acts to oppose said change; and
    said first pull-up gate and said second pull-up gate have respective design parameters giving said first pull-up gate a lower conductance than said second pull-up gate.

13. An integrated circuit memory as claimed in claim 12, wherein said design parameters include at least one of gate width, gate length and threshold voltage.

14. An integrated circuit memory as claimed in claim 7, wherein
    said first gate circuit comprises a first pass gate and said second gate circuit comprises a second pass gate, said first pass gate and said second pass gate having respective design parameters giving said first pass gate a lower conductance than said second pass gate;
    during a write access that forces a change in a signal level of said output of said first inverter away from a signal level of said second supply rail, said first pull-down gate acts to oppose said change; and
    said first pull-down gate and said second pull-down gate have respective design parameters giving said first pull-down gate a lower conductance than said second pull-down gate.

15. An integrated circuit memory as claimed in claim 14, wherein said design parameters include at least one of gate width, gate length and threshold voltage.

16. An integrated circuit memory comprising:
    memory cell means having:
       (i) bit value retention means for retaining a bit value;
       (ii) first gate means for selectively coupling said bit value retention means to a first node means; and
       (iii) second gate means for selectively coupling said bit value retention means to a second node means; and
    access control means for controlling said first gate means and said second gate means such that:
    during a write access to said bit value retention means said first gate means and said second gate means are both open; and
    during a read access to said bit value retention means said first gate circuit is open and said second gate means is closed.

17. A method of controlling an integrated circuit memory having:
    a memory cell having:
       (i) a bit value retention circuit;
       (ii) a first gate circuit selectively coupling said bit value retention circuit to a first node; and
       (iii) a second gate circuit selectively coupling said bit value retention circuit to a second node,
    said method comprising the steps of:
    during a write access to said bit value retention circuit, controlling said first gate circuit and said second gate circuit to both open; and
    during a read access to said bit value retention circuit, controlling said first gate circuit to open and said second gate circuit to close.

* * * * *